US009634411B2

(12) United States Patent
Brand

(10) Patent No.: US 9,634,411 B2
(45) Date of Patent: Apr. 25, 2017

(54) CONTACT DEVICE MECHANICALLY MOUNTABLE AND ELECTRICALLY CONNECTABLE ON A PRINTED CIRCUIT BOARD BY A FASTENING PORTION FOR RECEIPT OF AN EXTERNAL PLUG ELEMENT

(71) Applicant: HKR Seuffer Automotive GmbH & Co. KG, Kupferzell (DE)

(72) Inventor: Matthias Brand, Kempten (DE)

(73) Assignee: HKR SEUFFER AUTOMOTIVE GMBH & CO. KG, Kupferzell (DE)

(*) Notice: Subject to any disclaimer, the term of this patent is extended or adjusted under 35 U.S.C. 154(b) by 0 days.

(21) Appl. No.: 14/951,943

(22) Filed: Nov. 25, 2015

(65) Prior Publication Data

US 2016/0233600 A1 Aug. 11, 2016

(30) Foreign Application Priority Data

Dec. 9, 2014 (DE) .................... 20 2014 105 937 U

(51) Int. Cl.

| | |
|---|---|
| ***H01R 12/00*** | (2006.01) |
| ***H05K 1/00*** | (2006.01) |
| ***H01R 12/91*** | (2011.01) |
| ***H01R 11/01*** | (2006.01) |
| ***H01R 11/03*** | (2006.01) |
| ***H01R 12/57*** | (2011.01) |
| ***H01R 12/58*** | (2011.01) |

(Continued)

(52) U.S. Cl.

CPC ............. *H01R 12/91* (2013.01); *H01R 11/01* (2013.01); *H01R 11/03* (2013.01); *H01R 12/57* (2013.01); *H01R 12/58* (2013.01); *H01R 12/718* (2013.01); *H01R 13/11* (2013.01); *H01R 13/115* (2013.01)

(58) Field of Classification Search

CPC ...... H01R 12/91; H01R 12/718; H01R 13/11; H01R 11/01; H01R 11/03; H01R 12/57; H01R 13/115; H01R 12/58; H01R 12/71

USPC ...................................................... 439/82, 83

See application file for complete search history.

(56) References Cited

U.S. PATENT DOCUMENTS 2,631,184 A * 3/1953 Sampson ............. H01R 12/718 439/82

FOREIGN PATENT DOCUMENTS

| | | |
|---|---|---|
| DE | 2547886 A1 | 5/1977 |
| DE | 19600189 A1 | 7/1997 |

(Continued)

*Primary Examiner* — Javaid Nasri

(74) *Attorney, Agent, or Firm* — Ware, Fressola, Maguire & Barber LLP

(57) ABSTRACT

A contact device which is adapted to be mechanically mounted and electrically connected on a printed circuit board by a fastening portion and serves for receiving an external plug element. The contact device comprises a contact portion for inserting the external plug element for forming an electrical contact, an elastic support element for movably supporting the contact portion and for providing a possibility of movement in all spatial directions, wherein the support element includes a fastening part by which the contact device is fastened on the printed circuit board, a contact part for directly supporting the contact portion and a center part for connecting the fastening part and the contact part, the fastening part and the contact part bent relative to the center part, and of movement of the contact part and center part are limited by predetermined distances from adjacent external limiting means in the fastened state.

15 Claims, 6 Drawing Sheets

(51) Int. Cl.
*H01R 13/115* (2006.01)
*H01R 12/71* (2011.01)
*H01R 13/11* (2006.01)

(56) References Cited

FOREIGN PATENT DOCUMENTS

| | | | |
|---|---|---|---|
| DE | 20305313 | U1 | 8/2004 |
| DE | 102004050715 | B3 | 3/2006 |
| DE | 102009053426 | A1 | 6/2011 |

* cited by examiner

Section A-A

CONTACT DEVICE MECHANICALLY MOUNTABLE AND ELECTRICALLY CONNECTABLE ON A PRINTED CIRCUIT BOARD BY A FASTENING PORTION FOR RECEIPT OF AN EXTERNAL PLUG ELEMENT

CROSS REFERENCE TO RELATED APPLICATION

This application claims priority under 35 USC §119 to German Patent Application No. 202014105937.7 filed on Dec. 9, 2014, which application is hereby incorporated by reference in its entirety.

TECHNICAL FIELD

The present invention relates to a contact device, and especially to a contact device adapted to be mounted on a printed circuit board for receiving an external plug means.

BACKGROUND OF THE INVENTION

A contact device or, resp., connecting means is known, for example, from document DE 203 05 313 U1, the connecting means being designed for providing a detachable plug-in connection between power rails. The known connecting means includes a specific contact spring having opposing contact tongues so that a contact zone is formed between the contact tongues. The contact tongues are surrounded at their sides facing away from each other by free ends of a super-spring and are appropriately resiliently forced toward each other. Between the opposing contact tongues another contact element such as the power rail or a plug may be inserted. The contact is formed between the contact tongues and the inserted plug means.

Document DE 196 00 189 A1 discloses a contact element for tab connector elements, wherein the contact element is substantially made of a stamped sheet part which is U-shaped and includes a bottom wall as well as side walls integrally formed with the bottom wall and spaced in parallel. The two side walls comprise contact spring arms by which a contact point is formed. Furthermore, in the bottom wall a tensile blocking element is provided, the tensile blocking element constituting a tensile direction stop for appropriate tab connector elements in the direction against the plug-in direction. The contact element is adapted to compensate for plug-in tolerances and mounting tolerances and exhibits oscillation-compensating characteristics.

Finally the document DE 10 2004 050 715 B3 discloses a contact element for electrically contacting two connectors, wherein the contact element on one side includes connectors by which the contact element is fastened to a base element. On the other side, between formed contact tongues plug elements or power rails can be inserted to be easily detachable. So as to dampen mounting tolerances and oscillations, between the fastening portion and the contact tongues a connecting member is arranged which exhibits oscillation-compensating characteristics due to its geometric design and length of extension so that the contact is prevented from detaching even in the case of oscillations between the base element to which the contact element is fastened and the contact tongues and, resp., the inserted plug element.

The afore-described known devices are directed, in alia, to the provision of a safe contact of the plug means in the contact tongues, wherein the safe contact is to be ensured even in the case of mounting tolerances and especially in case oscillations occur. This relates in particular to oscillations between a particular contact means and a plug means to be inserted into the contact means.

The contact element known from document DE 10 2004 050 715 B3 has an appropriate elastic portion, wherein there is the problem, however, that when inserting or removing a respective plug means (a plug element) forces are exerted on the entire arrangement of the contact element so that, irrespective of any elasticity of the material, deformation of the contact element cannot be excluded. Furthermore, due to the elastic characteristics of particular parts of a contact element the contact element or plug elements to be inserted cannot be imperatively guided in a precise manner during assembly.

SUMMARY OF THE INVENTION

Therefore, the object underlying the present invention is to design a contact device of the type as mentioned in the beginning so that, on the one hand, even in the case of oscillations of the entire arrangement, safe contact as well as precise and safe mounting is ensured.

In accordance with the invention, this object is achieved by a contact device comprising the features listed in the claims.

The present invention relates to a contact device which is adapted to be mechanically fastened and electrically connected on a printed circuit board by a mounting portion and serves for receiving an external plug element, comprising a contact portion for inserting the external plug element to form an electrical contact, an elastic support element configured to movably support the contact portion and to provide a possibility of movement in all spatial directions, wherein the support element includes a fastening part by which the electrical contact device is fastened on the printed circuit board, a contact part for directly supporting the contact portion and a center part for connecting the fastening part and the contact part, and the fastening part and the contact part are bent relative to the center part, and wherein the possibilities of movement of the contact part and the center part are limited by predetermined distances from neighboring external limit means in a fastened state of the contact device on the circuit board.

The electrical contact device according to the invention is designed in combination with plural sections (and preferably in one piece) and comprises elastic portions (support element) so that oscillations occurring to a predetermined extent (relative movements) between the contact device and a plug element to be inserted can be compensated. The contact device further includes a basic strength irrespective of the possibility of elastic oscillations so that mounting can be safely and accurately performed. Hence easy and safe assembly is guaranteed. External plug elements can be inserted easily and equally safely without the risk of the contact device being deformed or bent in an inadmissible or undesired manner (i.e. plastically) in the position after complete mounting, as movements and oscillations are possible to a restricted extent only and safe limitations are ensured by external components in accordance with a mechanical interaction. The limitation of movements of the contact device (or else of parts thereof) is possible by the external limit means to a fixed (predefined) extent only (predefined amplitudes). Internal limitations at the contact device are not required.

The contact device can be fastened on a base element such as a circuit board, wherein on the other side the contact portion is arranged. Then a plug element (for example in the form of a tab connector) can be inserted. Movements of the plug element relative to the circuit board are compensated to a predetermined extent by the elastically configured contact device. In this way oscillations of the circuit board are efficiently prevented from being transmitted to the plug element or oscillations imparted to the plug element due to its further connections are prevented from being transmitted to the circuit board. Thus the contact device in the afore-described manner very efficiently causes the inserted plug element to be uncoupled in terms of oscillations relative to the circuit board to which the contact device can be mechanically fastened and electrically contacted. At an idle position of the contact device the external limit means are not contacted so that free oscillation is possible to a predetermined extent (with predetermined amplitude).

Further configurations are described in the corresponding subclaims.

After fastening the contact device on the printed board the contact portion may protrude into an opening in the printed circuit board in a contact-free manner and the contact portion may include a stop element extending away from the contact portion, wherein a movement in the direction of extension of the contact part is delimited by the stop element or by any one of the external limit means.

The printed circuit board may be inserted in a housing including a cover element and the cover element may be arranged adjacent to the center part of the contact device fastened on the circuit board and may form the limit element.

After fastening the contact device on the circuit board, the contact portion may protrude into an opening in the printed circuit board in a contact-free manner and the contact portion may be delimited during movement in the plane of the circuit board by the opening in the circuit board.

The fastening part, the center part and the contact part may be made of strip-shaped elastic material and between the fastening part and the center part as well as between the center part and the contact part respective bending portions may be formed in which the respective members are bent relative to each other.

The contact device can be orientated relative to the circuit board after being fastened on the circuit board by the fastening part such that in the force-free state the contact device takes a position exhibiting the predefined distances from the external limit means.

The fastening part and the contact part can be formed partly and the center part can be formed completely of a plurality of lamellas and the lamellas may extend from a first intermediate land of the fastening part via the center part to a second intermediate land of the contact part.

The lamellas and interstices between the lamellas may extend as to their width and longitudinal extension in a respective plane of extension of the fastening part, the center part or the contact part or may include at least partly in their widthwise extension a predefined angle relative to the plane of extension of the respective fastening part, center part or contact part.

At least in the area of the center part and at least partially in their widthwise extension the lamellas may have the predefined angle relative to the plane of extension of the center part, and the angle may be a right angle or may be less than 90°.

The width of the lamellas and their respective interstices between the lamellas may be equal or different for all lamellas and interstices.

BRIEF DESCRIPTION OF THE DRAWINGS

Hereinafter the invention shall be described in detail by way of embodiments with reference to the drawing, in which.

DETAILED DESCRIPTION

First Embodiment

Hereinafter the structure and the mode of action of the contact device according to the invention in accordance with a first embodiment will be described in detail with reference to FIGS. 1 to 3.

Figure 1:
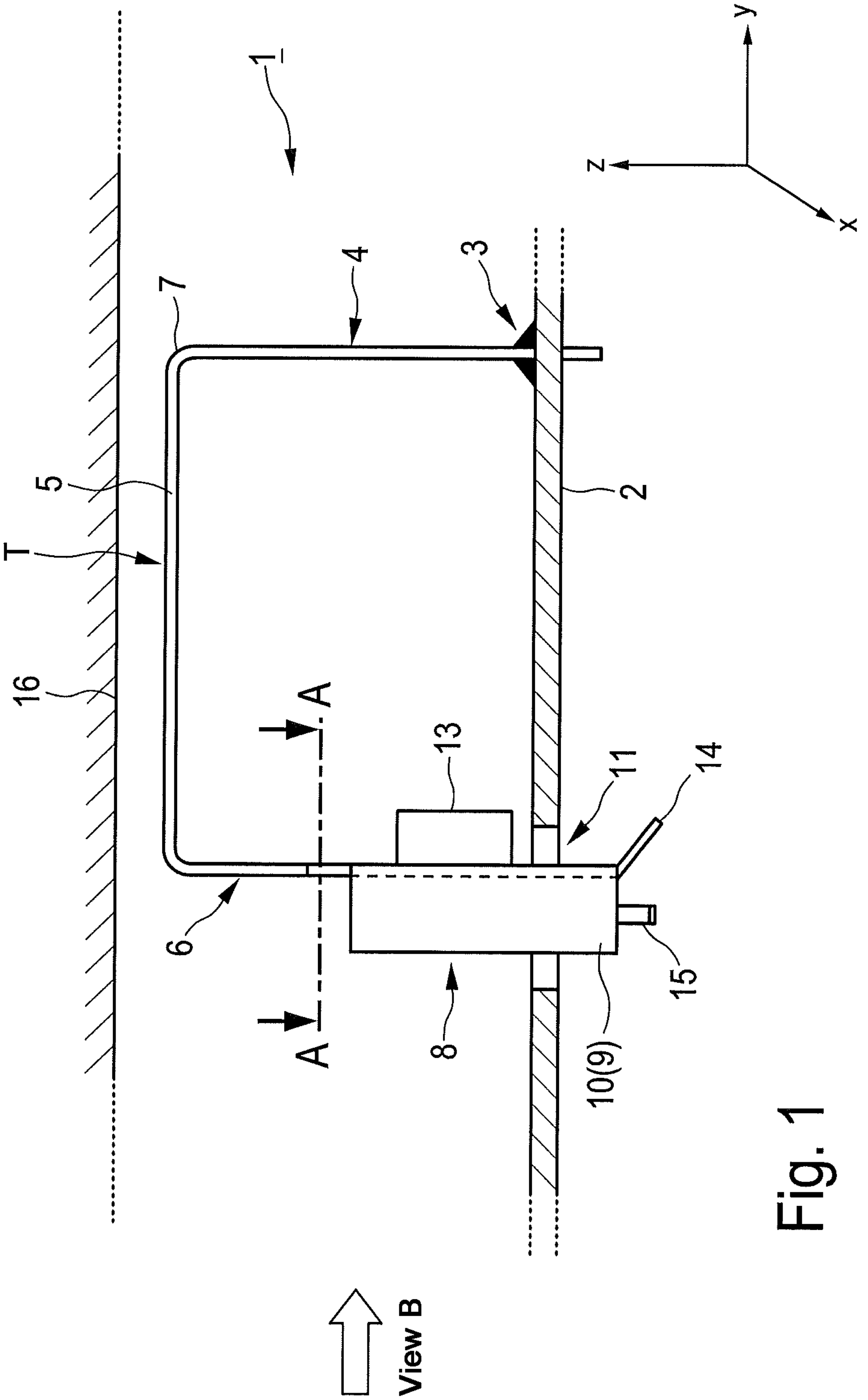
FIG. 1 shows an overall arrangement of the contact device fastened to a printed circuit board according to a first embodiment.

In the representation according to FIG. 1 the contact device 1 is shown in its entirety, wherein the contact device 1 can be arranged or mounted on a printed circuit board 2. FIG. 1 illustrates the contact device 1 at the position mounted on the circuit board 2 and thus in connection with an application. The fastening of the contact device 1 on the circuit board 2 is performed by a fastening portion 3 of the contact device 1, the contact device 1 being safely fastened on the printed circuit board 2 both in the electrical and mechanical respect. The contact device 1 is thus connectable to the printed circuit board 2 in a mechanically stable manner and in the connected state also includes an electric (galvanic) contact.

The printed circuit board 2 represents an example of a base element on which the contact device 1 can be mounted. The present invention is not restricted to the option of mounting the contact device 1 on the printed circuit board 2; rather a plurality of base elements which are equal or similar to the printed circuit board 2 may be used. The base element or, for example, the printed circuit board 2 thus supports the contact device 1 after mounting.

The contact device 1 substantially comprises three main parts, a fastening part 4, a center part 5 and a contact part 6. The fastening part 4, on the one hand, includes the fastening portion 3 and is fastened with the same on the base element or the printed circuit board 2. The fastening part 4, on the other hand, is adjacent to the center part 5 via a bending portion 7. In the bending portion 7 the center part 5 may be curved or bent relative to the fastening part 4.

The center part 5 is thus adjacent, on the one hand, to the fastening part 4 and, on the other hand, to the contact part 6 via a further bending portion 7. The bending portion 7 between the center part 5 and the contact part 6 helps to bend or curve these two parts relative to each other.

According to the representation in FIG. 1, the contact part 6 comprises on its side opposed to the bending portion 7 a contact portion 8 which is formed in the way that an external plug element (not shown) (sometimes referred to as an external plug means or plug means) can be inserted in the contact portion 8 of the contact part 6, wherein an electrical contact (galvanic connection) and a mechanically stable connection are simultaneously established.

Figure 2:
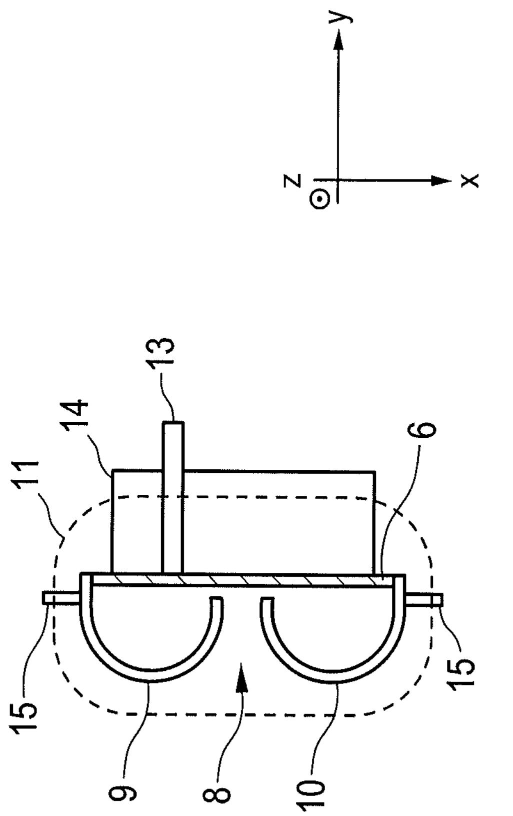
FIG. 2 shows a sectional view A-A corresponding to the illustration of FIG. 1.

The contact portion 8 is shown in a side view in FIG. 1, while FIG. 2 permits a top view of the contact portion 8 by the sectional view along the line A-A according to FIG. 1. FIG. 3 shows a view of the contact portion 8 corresponding to the arrow shown in FIG. 1 according to view B. For facilitated designation of the respective directions, FIGS. 1 to 3 show a respective three-dimensional coordinate system consisting of the axes x, y and z normal to each other. The sectional representation according to FIG. 2 thus forms an illustration viewing in the negative z-direction, and the view B according to FIG. 3 (arrow in FIG. 1) illustrates a representation in the positive y-direction.

Figure 3:
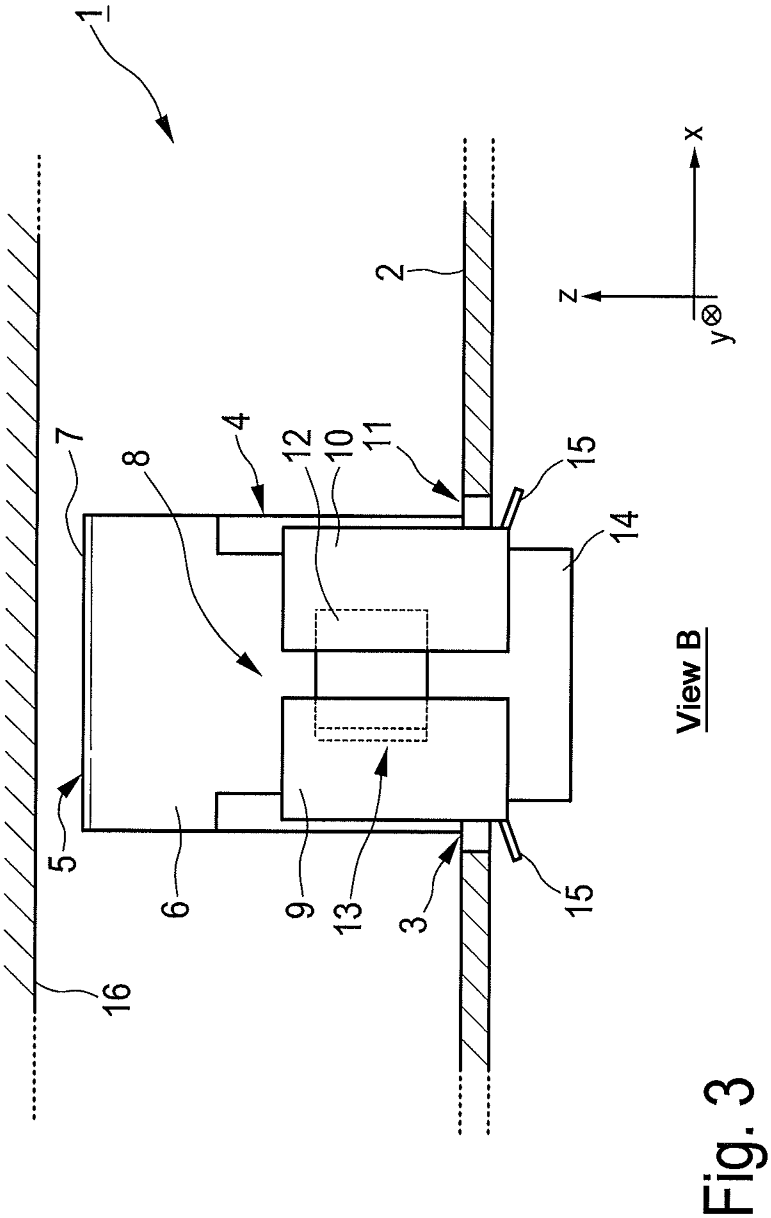
FIG. 3 shows a view B of the contact device according to FIG. 1.

According to FIGS. 1 to 3, the contact portion 8 of the contact part 6 of the contact device 1 comprises first and second curved elements 9 and 10 which are integrally formed at the respective rim of the contact part 6 and are bent toward each other so that, according to the representation in FIG. 2, between the opposed free ends of the respective first and second curved elements 9 and 10 and the contact part 6 a small interstice is retained into which a plug element, for example an appropriately shaped tab connector, can be inserted. The distance of the free ends of the first and second curved members 9 and 10 from the contact part 6 is smaller than the thickness of an external plug element to be inserted (e.g. a tab connector) so that, on the one hand, the required electric contact connection (galvanic connection) is formed and, on the other hand, the plug element is maintained in a mechanically safe manner due to the clamping effect between the free ends of the first and second curved elements 9 and 10 and the contact part 6 (also in connection with a corresponding friction).

Figure 4:
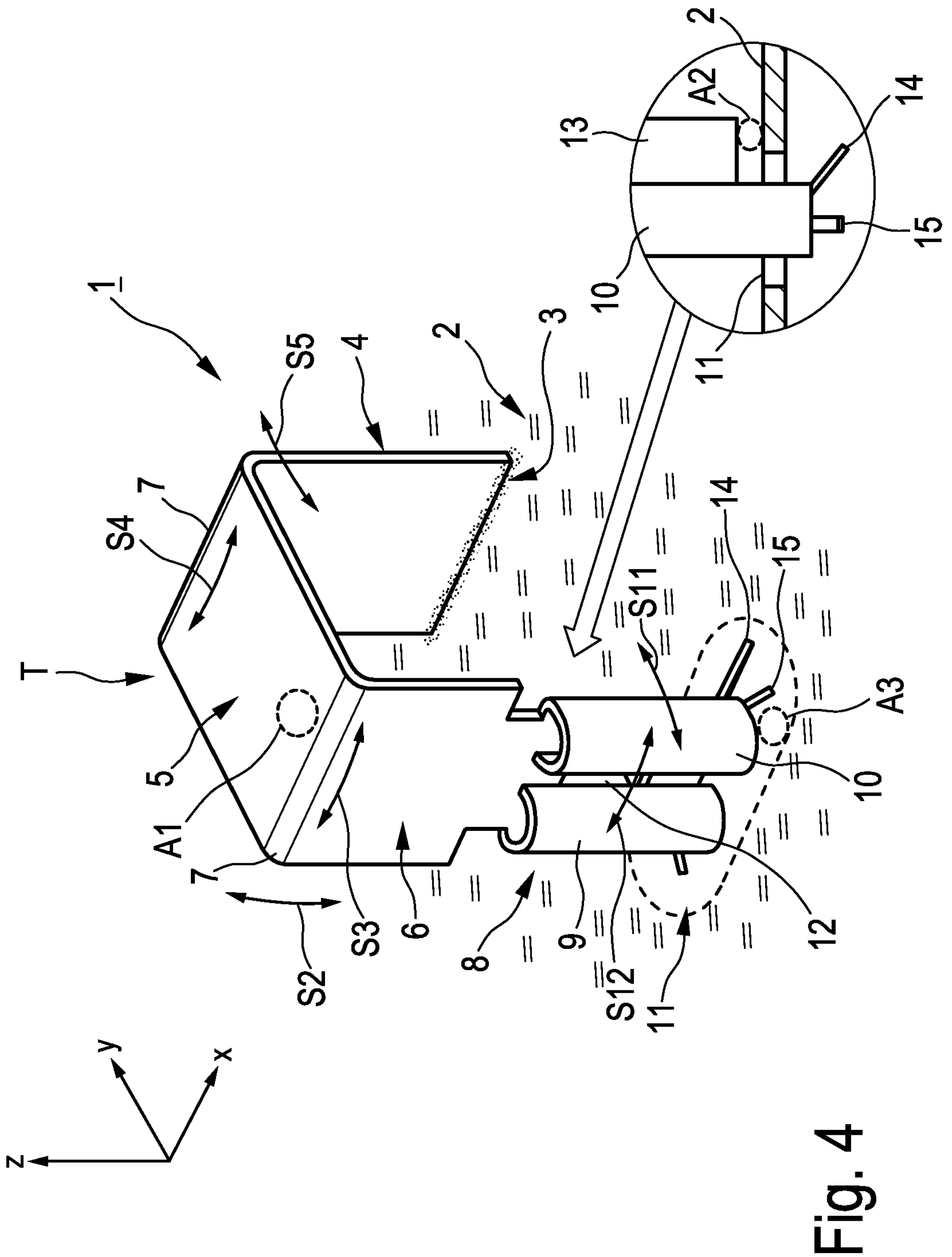
FIG. 4 shows a simplified perspective representation of the contact device for illustrating possible elastic movements.

A perspective view of the contact device 1 in simplified form is shown in FIG. 4. It is evident here that the main parts of the contact device 1 such as the fastening part 4, the center part 5 and the contact part 6 are formed of strip-shaped material, wherein the two curved elements 9 and 10 are equally part of this strip-shaped material and are bent or shaped relative to the arrangement of the contact part 6 in the afore-described manner so that in combination with a clamping effect the plug element (not shown) can be safely used in the electrical and mechanical respect. The contact device 1 is thus preferably integrally formed, wherein the invention is not restricted hereto, however. Rather, the contact device may also be composed of plural elements. For example, the curved elements 9 and 10 may also be attached to the contact part 6.

The three main parts of the contact device, i.e. the fastening part 4, the center part 5 and the contact part 6, are interconnected by the appropriate bending portions 7, wherein not imperatively but preferably the fastening part 4 is mountable at right angles relative to the printed circuit board 2 and on the same. Instead of the right angle, also an appropriate angle deviating from 90° may be used. Relative to the fastening part 4, the center part 5 is equally bent or curved substantially by 90°, wherein even regarding this angle the present invention is not fixed to 90°, but any other adequate angle close to 90° or any other expedient angle may be used. Similarly, the contact part 6 is bent relative to the center part 5 by approx. 90° in the bending portion 7, wherein in this case, too, the angle of 90° constitutes a preferred angle to which the invention is not fixed, however. Substantially with consideration of appropriate tolerances and of preference, the fastening part 4 and the contact part 6 thus extend approximately in parallel, wherein between the two components of the contact device 1 also a corresponding angle depending on the dimensioning of the entire contact device 1 may be provided, however.

In accordance with the representation in FIGS. 1, 3 and 4, it is evident that the contact part 6 including the contact portion 8 is formed to be longer than the distance between the center part 5 and the printed circuit board 2, wherein due to the afore-described and preferred configuration of the contact device 1 the center part 5 is approximately parallel to the surface of the printed circuit board 2 (of the base element). The contact portion 8 of the contact part 6 protrudes with the two curved elements 9 and 10 into an opening 11 in the printed circuit board 2, when the contact device 1 is inserted in the printed circuit board 2 and, resp., is electrically and mechanically connected to the printed circuit board 2 in the fastening portion 3. Inside the opening 11 in the printed circuit board 2 the contact portion 8 and the contact part 6 do not contact the rim of said opening 11 in a force-free state (which can also be referred to as idle state or idle position), wherein in detail there is a minimum distance from the inner rim of the opening 11 in the printed circuit board 2 for each part of the contact portion 8 and the contact part 6.

The fastening part 4, the center part 5 and the contact part 6 form a support element T for the contact portion 8 into which a plug element is insertable. By the support element T the contact portion 8 is supported and positioned in the opening 11, respectively, in a flexible and vibratory manner (i.e. movably to a predetermined extent).

The contact device 1 and especially the contact part 6 comprises inside the contact portion 8 on the side facing the free ends of the two curved elements 9 and 10 a recess 12 in the material of the contact part 6 which preferably takes a square or rectangular shape in the material of the contact part 6, and wherein by the configuration of the recess 12 a stop element 13 is formed which extends from a rear surface of the contact part 6 at one side of the recess 12 and on the other side of the arrangement of the two curved elements 9 and 10 away from the contact part 6. The direction of extension of the stop element 13 is approximately in the positive y-direction. The stop element 13 preferably (but not imperatively) is perpendicular to the rear surface of the contact part 6 in the area of the contact portion 8 or at an appropriate angle, wherein equally the stop element 13 is arranged at its position spaced apart from the upper surface of the printed circuit board 2, when the contact device 1 to be mounted on the printed circuit board 2 is inserted, i.e. is fastened on the printed circuit board 2 by the fastening portion 3.

The stop element 13 thus forms an undercut for a movement of the contact part 6 and especially of the contact portion 8 in the opening 11 of the printed circuit board 2 so that, when the contact portion 8 and hence also of the stop element 13 moves downwards, the stop element 13 contacts the upper surface of the printed circuit board 2, but in a simple manner cannot pass through the opening 11 in the printed circuit board 2. In this way the movement of the contact part 6 of the contact device 1 is delimited in the negative z-direction.

In the sectional view according to FIG. 2 the stop element 13 is shown on the other surface of the contact part 6 in a top view onto the narrow side, i.e. on the other side of the contact part 6 relative to the arrangement of the first and second curved elements 9 and 10. FIG. 3 shows in partly dotted line the recess 12 and, equally viewed from a narrow side, the stop element 13. The free surface of the recess 12 is provided approximately in the x-z plane.

The contact device 1 further comprises in a lower portion of the contact part 6 and thus below the contact portion 8 a first guide element 14 extending diagonally downwards relative to the arrangement of the contact part 6 and with respect to the shown coordinates extending at an angle having components in the negative z-direction and the positive y-direction.

Equally below the contact portion 8, the contact device 1 further includes second guide elements 15 which extend diagonally downwards (according to the representation in FIG. 3) at each narrow side of the contact part 6 below the respective first and second curved elements 9 and 10, for example at an oblique angle in the positive x-direction and the negative z-direction.

The first guide element 14 and the second guide elements 15 serve for guaranteeing facilitated insertion when inserting an external plug element (not shown) into the contact portion 8 of the contact device 1 by forming appropriate inclinations so that, for example, a tab connector to be inserted can be specifically inserted, even if the plug element, e.g. in the form of the tab connector, is approached to the contact portion 8 in an unprecise manner. In this way the insertion of an external plug element into the contact device 1 and especially into the contact portion 8 for establishing an electrical contact is facilitated, even if the contact device 1 (the support element T) and thus the contact portion 8 are arranged to be movable to a predetermined extent due to the elastic properties.

In the representation of the contact device 1 according to FIG. 1, the contact device 1 mountable onto the printed circuit board 2 is illustrated in the state fastened on the printed circuit board 2, wherein the contact part 6 protrudes into the opening 11 of the printed circuit board 2 by the contact portion 8 and wherein the inner wall of the opening 11 in the printed circuit board 2 is not contacted in the mounted and force-free state (idle state). During application, the printed circuit board 2 including the contact device 1 arranged thereon may be arranged in a housing, wherein the housing (not shown in the Figures) is closed by a cover element 16 for protection of the contact device 1 and further components arranged on the printed circuit board 2, for example. The cover element 16 is provided on the housing (not shown) so that a predefined small distance of the cover element 16 is formed from the upper area of the contact device 1 and especially from the center part 5 (the upper surface thereof in the Figures). Such situation is shown in each of the FIGS. 1 and 3, while in FIG. 4 the cover element 16 is omitted for better perspective representation of the contact device 1, but in fact it is adjacent to and arranged above the center part 5.

In FIG. 4 the contact device 1 including its afore-described components is shown in perspective, wherein the components can be made of metallic material, for instance a sheet metal strip. In detail the contact device 1 may be punched out of such sheet metal so that an appropriate sheet metal strip is formed in which the respective bends are made in the bending portions 7, with the recess 12 being punched out and the stop element 13 being produced by punching and bending, for example, the first and second guide elements being punched and bent and especially in the contact portion 8 the two curved elements 9 and 10 are appropriately bent so that the contact portion 8 is suited for receiving a plug element (not shown; for example a tab connector). The sheet thickness for forming the contact device 1 may be selected within a range of from 0.4 mm to 2.5 mm depending on the dimensioning (the mechanical dimensions) and the use. The present invention is not fixed to the said dimensioning, and depending on the application, smaller or larger sheet thicknesses may be chosen as well.

Apart from the option to manufacture the contact device 1 from the afore-described sheet (use of a sheet metal strip as a basis), the contact device 1 may also be made of a plastic strip having a metallized or metal-coated surface for providing a required current conduction.

The functioning and mode of action of the contact device 1 having the afore-described structure according to the first embodiment shall be described in detail hereinafter. Reference is made to FIGS. 1 to 4, especially to the perspective representation in FIG. 4.

According to the foregoing description and corresponding to the side view according to FIG. 1, in the mounted state of the contact device 1, i.e. when the contact device 1 is mounted on the printed circuit board 2 in the fastening portion 3, the contact device 1 is formed in its desired configuration and shape, with the contact device 1 being elastically deformable to a predetermined extent. In particular, depending on the dimensioning of the contact device and the opening 11 in the printed circuit board 2, an elastic movement of the contact device 1 and an oscillation may take place. In order to avoid a significant oscillation amplitude and accompanying damage or destruction of the contact device 1 or else to avoid plastic deformation the possible movements of the contact device 1 are restricted in the state of the contact device 1 mounted on the printed circuit board 2.

As is visible in FIG. 1, the contact device 1 contacts the printed circuit board 3 only in its fastening portion 3, wherein the fastening portion 3 constitutes a fixed point regarding the movement of the contact device 1. Assuming a force-free position of the contact device 1 in the mounted state, the contact device 1 contacts neither the superimposed cover element 16 nor the printed circuit board 2 in the area of the opening 11 in the printed circuit board 2. Within predetermined limits, thus minor movements or oscillations of the contact portion and, resp., of the entire contact device 1 are possible during interaction with external limit means.

For delimiting the movement or oscillation amplitude of the components of the contact device 1 (e.g. the components of the support element T), according to the representation in FIG. 4 a first distance A1 is provided between the upper surface of the center part 5 and the superimposed cover element 16. This is shown in FIG. 4 by a circular surface (broken circle), wherein in the area of said circular surface the first distance A1 from the superimposed cover element 16 (not shown in FIG. 4) is provided.

Another (second) distance A2 is formed in FIG. 4 between the upper surface of the printed surface board 2 and the lower edge of the stop element 13 (illustrated in FIG. 1, for example). This is shown in a particular cutout in FIG. 4 equally by a broken circle.

Furthermore, the contact portion 8 and especially the two curved elements 9 and 10 include a third distance A3 from the inner rim of the opening 11 in the printed circuit board 2. This is shown symbolically for the purpose of illustrating this fact between the second curved element 10 and the inner rim of the opening 11 by a broken circle and is provided with the reference numeral A3. The contact portion 8 and especially the two curved elements 9 and 10 protrude into the opening 11 of the printed circuit plate 2. When the contact device is fastened on the printed circuit board 2 in a force-free manner, the contact portion 8 is inserted in the opening 11 in a contactless manner (idle state or idle position) and the third distance A3 is formed.

FIG. 4 further illustrates possible movements with respect to the elastic design of the contact device 1, wherein they are illustrated by the arrows S11, S12 and S2 to S5 for the purpose of illustrating the substantial possible movements and oscillations of the contact device 1, when the latter is mounted on the printed circuit board 2 by the fastening portion 3. Further movements and oscillations of different type and with mutual influence and superposition are possible.

The contact portion 8 is movable to a small extent corresponding to the third distance A3 inside the opening 11 in the printed circuit board 2, wherein this corresponds to a movement (and also oscillation) in the plane of the printed board 2 and, corresponding to the three-dimensional coordinates, to a movement of the contact portion 8 in the x-y plane. The contact portion 8 is further equally movable perpendicularly to said plane, such movement corresponding to a z-direction (negative or positive) substantially perpendicularly to the plane of the printed circuit board 2. The first movements or oscillations in the x-y plane are denoted with S11 and S12. A movement perpendicularly to said plane in the z-direction is denoted with S2. The first movements according to the arrows S11 and S12 also affect the bending portion 7 between the contact part 6 and the center part 5, wherein this is denoted by a third movement S3. Corresponding oscillations or movements are resulting for the bending portion 7 between the center part 5 and the fastening part 4, for example, said fourth movement being denoted with S4. The bending portion 7 between the fastening part 4 and the center part 5 is equally capable of performing fifth movements or oscillations that are denoted with S5. Relative to said movements, the fastening portion 3 at the printed circuit board 2 is a fixed point.

If, for example, an external plug element is inserted in the contact portion 8 between the free ends of the two curved elements 9 and 10 and the contact part 6, a force is mostly exerted in the positive z-direction, wherein also movements corresponding to precision of inserting the plug element (not shown) in the x-y plane according to the possible movements S11 and S12 may occur. Equally, movements according to S3 are occurring. In this case the portion of the center part 5 marked with A1 in the vicinity of the bending portion 7 to the contact part 6 can approach the superimposed cover element 16 not shown in FIG. 4, which is reproducible corresponding to FIG. 1. When high forces occur upon insertion of the plug element in the positive z-direction, then the center part 5 can move especially in its front area neighboring the contact part 6 up to the lower surface of the cover element 16 and temporarily contact the same. In this way, the movement in the positive z-direction of the contact device 1 (especially the contact part 6) is delimited. According to FIG. 4 it is evident that corresponding small or minimum movements occurring during insertion of a plug element into the contact portion 8 also may cause movements according to FIG. 4 and to the arrows S4 and S5 (fourth and fifth movements), especially when during insertion the first distance A1 in the corresponding portion is covered during the movement and said portion of the center part 5 contacts the cover element 16 at least temporarily or for a short time.

If, on the other hand, an external plug element inserted in the contact portion 8 is assumed and if said plug element is withdrawn or removed from the contact device 1 and especially from the contact portion 1, forces are exerted substantially in the negative z-direction, wherein in this case, according to the representation in FIG. 4, a delimitation of the movement of the contact device 1 and in particular of the contact portion 8 in the negative z-direction is obtained by the stop element 13. When the distance A2 (indicated by a circle in FIG. 4) is overcome during movement in the negative z-direction, the surface of the printed circuit board 2 is contacted by the lower edge of the stop element 13. Unprecise handling when removing the plug element (not shown in the Figures) from the contact portion 8 equally entails further movements according to the arrows S11 and S12 in the x- and y-planes, wherein delimitation of the movement by at least the third distance according to reference numeral A3 between the parts of the contact portion 8 and the inner wall of the opening 11 in the printed board 2 delimits the movement in the opening 11.

Thus delimitation of possible oscillations or movements according to the arrows S11 and S12 in the x-y plane is resulting from the third distance A3 inside the opening 11, while upon inserting an external plug element into the contact portion 8 a possible movement beyond the first distance A1 is delimited between the center part 5 and the superimposed cover element 16 and especially by abutment against the cover element 16 (possible movement substantially in the longitudinal extension of the contact part 6). When the plug element is unplugged or removed from the contact device 1, the possible movement in the negative z-direction beyond the second distance A2 according to FIG. 4 is delimited (possible movement substantially in the longitudinal extension of the contact part 6) in that the stop element 13 contacts the printed board 2 after overcoming the second distance A2 (deflection from the idle position).

The afore-described components of the contact device 1 in the inserted state fastened to the printed board 2 enable possible elastic movements and concrete delimitations of the possible movements by appropriate predetermined distances and, after overcoming said distances, by appropriate abutments against and/or interaction with external limit means (cover element 16, printed circuit board 2 with opening 11) and in combination with internal components (stop element 13) so that the entire contact device 1 is efficiently prevented from being damaged or bent, while at the same time it is possible to insert or remove an external plug element (e.g. a tab connector) into or from the contact device 1 (especially the contact portion 8) safely and without any further aids so that safe assembly is ensured.

In particular, delimitations of movements are substantially carried out in the negative or positive z-direction by the first distance A1 and the second distance A2, while related lateral movements of the contact portion 8 in the x-y plane are delimited by the opening 11 in the printed circuit board 2 (third distance A3). In the force-free state, i.e. in a state of mounting the contact device 1 on the printed circuit board 2 and after completed insertion of an external plug element or removal of a plug element, the afore-described distances A1, A2 and A3 are provided in connection with the idle position so that within said distances elastic oscillation is possible. The predefined distances A1, A2 and A3 according to the representation in FIG. 4 thus relate to a particular possibility of movement based on the imaginary idle position of the contact device 1 after mounting (fastening) on the printed board 2 and in the force-free state (assumed when a plug element is inserted).

A corresponding situation is also given when an external plug element is inserted in the contact portion 8, but the plug element including its connectors exerts no further forces (after completion of the inserting operation) on the contact device 1 in the idle state. In the idle state, i.e. when no plug element is inserted or when a plug element is inserted in a force-free manner after insertion, the center part 5 is provided with the small distance A1 below the cover element and does not contact the same. The third distance A3 is shown in FIG. 4 merely in connection with the second curved element 10, said third distance A3 is provided, however, on all sides of the contact portion 8, with the opening 11 being appropriately dimensioned and shaped in the printed circuit board 2. Thus for movement or oscillation according to the arrows S11 and S12 in the x-y plane in all directions substantially the same distance according to the third distance A3 is provided.

If it is further assumed that a plug element is inserted and a relative movement occurs between the plug element including its connectors and the printed circuit board 2 and, resp., the housing into which the printed circuit board 2 is inserted, the contact device 1 can compensate minor movements to the extent of the respective distances A1 to A3 by the elastic characteristics in an elastically resilient manner. Consequently, forces acting on the contact device 1 between the inserted plug element and the contact portion 8 are reduced and hence an electrically as well as mechanically safe and reliable contact is formed. This is especially important when the contact device 1 is used in a region, for instance a machine, where oscillations and vibrations are inevitable and, resp., occur during usual operation. This is possible in work machines or else in the field of automotive vehicles.

The contact device 1 thus can ensure free oscillation of the contact portion 2 (especially according to the arrows S11, S12, S2 and S3) by oscillations corresponding to the predetermined possible amplitudes in the mounted state on the printed circuit board 2 and after insertion of an external plug element into the contact portion 2 in the case of forces occurring, wherein the contact portion 8 is elastically supported by the support element (4, 5, 6). The possibility of elastic oscillation of the contact device 1 within the admissible or mechanically possible amplitudes, i.e. within the afore-described limitations, may provide for obtaining effective oscillatory uncoupling between the inserted plug element, on the one hand, and the printed circuit board 2, on the other hand. The contact portion 8 can perform especially elastic movements of corresponding predetermined amplitude in accordance with the distances A1 to A3 in all three spatial directions. If the amplitudes are exceeded, a respective component of the contact device 1 arrives at the respective (external) stop, thus causing the movement to be safely delimited and undesired bending or further damage of the contact device 1 to be prevented.

Second Embodiment

In accordance with the afore-described first embodiment and corresponding to the illustration in FIGS. 3 and 4, for example, the contact device 1 consists of a band material, with appropriate portions of the contact device 1 being curved or bent in a predetermined manner. Preferably, in the contact device 1 related to the first embodiment a strip-shaped sheet metal was used, wherein the basic structure of the contact device 1 was punched out and then the components of the contact device 1 were appropriately bent (for instance at the bending portions 7). The contact device 1 according to the second embodiment is preferably integrally formed of one material in the same way as that of the first embodiment and includes plural portions.

Figure 5:
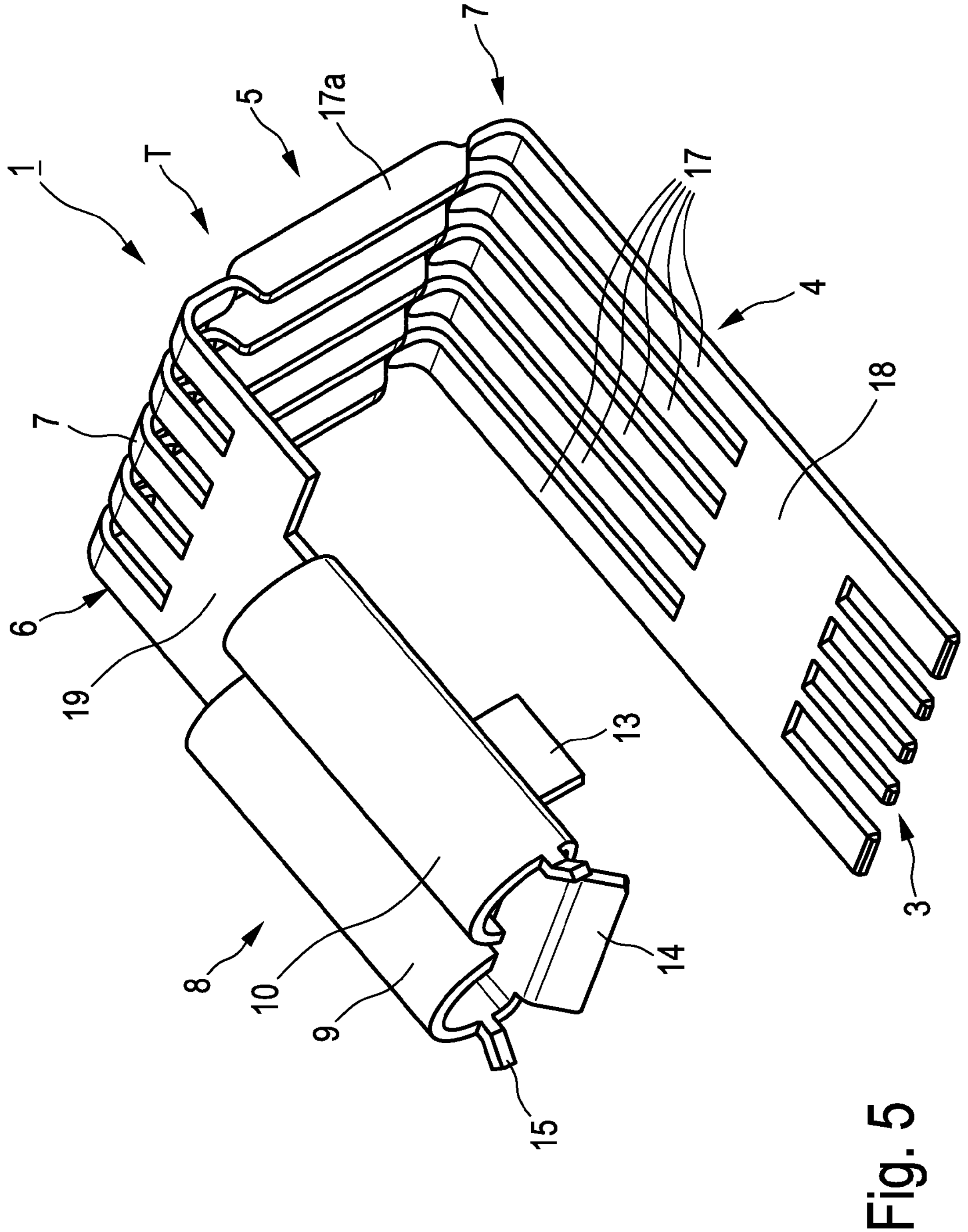
FIG. 5 shows a perspective overall representation of the contact device according to a second embodiment of the present invention.

On the other hand, the contact device 1 according to the second embodiment is made of an originally band-shaped material, as for example and preferably of sheet metal, wherein, according to the representation in FIG. 5 in which the same reference numerals are used for similar components of the first embodiment, a plurality of lamellas 17 is formed in the complete center part 5 and partially in the fastening part 4 and in the contact part 6 so that, instead of a continuous part made of sheet metal such as the fastening part 4, the center part 5 and the contact part 6, said components now entirely or partly include the plurality of lamellas 17. The plurality of lamellas 17 extends from a first intermediate land 18, which is part of the fastening part 4, to a second intermediate land 19, which is part of the contact part 6. In the area of the center part 5 for example and preferably no intermediate land is provided. Furthermore, for forming the fastening portion 3 of the fastening part 4 equally a predetermined number of lamellas or individual forks may be formed which extend downwards from the first intermediate land 18 in the opposite direction to the lamellas 17 according to the representation in FIG. 4 and can mechanically positively engage in corresponding openings in the printed circuit board 2.

The lamellas 17 in the fastening part 4, the center part 5 and the contact part 6 are thus interconnected by the first intermediate land 18 in the fastening part 4 and the second intermediate land 19 in the contact part 6. In the areas between the first and second intermediate lands 18 and 19 the lamellas 17 are free-running without being interconnected. In the same way as with the closed band material underlying the contact device 1 according to the first embodiment, narrow portions are formed between each of the fastening part 4 and the center part 5, on the one hand, and the center part 5 and the contact part 6, on the other hand, as bending portions 7, wherein the lamellas 17 are curved or bent similarly to the first embodiment and about similar angles. The lamellas 17 extend (preferably without any further lands) over the respective bending portions 7.

Furthermore, the contact portion 8 including the first and second curved elements 9 and 10 is configured similarly to the first embodiment. Irrespective of the configuration of the contact device 1 including lamellas 17 in the afore-described manner, the support element T is formed, corresponding to the first embodiment, by the components 4, 5 and 6 (preferably integrally with plural portions) and elastically supports the contact portion 8.

The contact device 1 according to the second embodiment in connection with the plurality of lamellas 17 offers the same advantages as the configuration of the contact device 1 according to the first embodiment, when the contact device 1 is mounted on the printed circuit board 2 in the manner as described before in connection with the first embodiment. Similarly to the first embodiment, in the second embodiment movements and oscillations are allowed, as they are described in connection with the first embodiment with respect to FIG. 4 and wherein the substantial possibilities of movement shown in FIG. 4 are also applicable to the arrangement of the contact device 1 according to the second embodiment. Hence free oscillation and thus oscillatory uncoupling of the contact device 1 relative to movements of an external plug element, for example, are guaranteed.

The contact device 1 according to the second embodiment is thus equally made of elastic material (metal or plastic) so that the movements and oscillations are possible, wherein, compared to the arrangement according to the first embodiment, the contact device 1 in connection with the plurality of the lamellas 17 depending e.g. on the number of lamellas and the width of the respective lamellas 17 permits adjusting and dimensioning the elasticity (section modulus of the entire assembly). In connection with the plurality of the lamellas 17 the elastic reaction with forces acting on the contact part 6 from outside is softer compared to the arrangement of the first embodiment in which the contact device 1 is made of the strip-shaped (closed) material.

The lamellas 17 and interstices between the lamellas are dimensioned to be equal or different as to their width and longitudinal extension in a respective plane of extension of the fastening part 4, the center part 5 or the contact part 6, and hence may exhibit the same or a different width.

The number of lamellas may comprise, for example, two lamellas having an interstice or, depending on the width of the contact device 1 (in the x-direction) up to sixteen lamellas having interstices. Preferably, five lamellas having respective interstices may be provided. This is exemplary and the present invention is not restricted to said number. In the side view, the state of the contact device 1 mounted on the printed circuit board 2 according to the second embodiment is thus similar to the arrangement according to FIG. 1.

The arrangement of the contact device 1 according to the second embodiment is similar to the first embodiment with respect to the distances A1, A2 and A3, as shown in FIG. 4. The arrangement of FIG. 4 thus is also applicable to the second embodiment. In connection with the design of the lamellas 17 in the support element T (fastening part 4, center part 5 and contact part 6) according to FIG. 5 the same advantages are achieved as in the afore-described arrangements according to the first embodiment of the contact device 1.

Modification of the Second Embodiment

In a modification of the arrangement of the second embodiment, for example in the area of the center part 5 according to the representation in FIG. 5 the lamellas 17 are formed to be twisted about approx. 90° along their longitudinal axis in the direction of extension for forming upright lamellas 17*a* of the center part 5. The upright lamellas are thus approximately at right angles or at an angle of less than 90° with respect to the surface of the center part 5 so that, when forces and especially lateral forces in the x-y plane (according to the arrows S11 and S12 as well as S3 in FIG. 4) act on the contact portion 8, a comparably soft elastic reaction of the contact device 1 is ensured in the case of said occurring forces or of oscillations.

In connection with the upright lamellas 17*a* compared to the lamellas 17 located within the respective plane of the fastening part 4, the center part 5 and the contact part 6, the embodiment including the upright lamellas 17*a* in the center part 5 represents an even softer more elastic characteristic (reduced section modulus), wherein there is furthermore the influence of the thickness and the type of the material of the contact device.

In the illustration according to FIG. 5 all lamellas (e.g. five lamellas according to the representation in FIG. 5) are shown as upright lamellas 17*a* in the center part 5. However, the invention is not fixed hereto, rather merely individual lamellas 17 may be formed in the center part 5 as upright lamellas according to the upright lamellas 17*a* in FIG. 5. Equally, the upright lamellas 17*a* may have the same widthwise extension or may be different in width and also equal or different interstices may be formed.

In combination with the configuration of the upright lamellas 17*a* in the center part 5 according to FIG. 5, too, the same advantages are achieved as in the afore-described arrangements in accordance with the first and second embodiments.

Variants of the First and Second Embodiments

In the representation of FIGS. 1 and 3, in the Figures the cover element 16 is shown above the contact device 1. In general, the printed circuit board 2 is inserted in a housing for forming a contact unit with the contact device 1, the printed circuit board 2 and the housing including the housing cover or cover element 16. Here the contact device 1 according to any one of the afore-described embodiments is adapted to be mounted on the printed circuit board 2 in the fastening portion 3.

If, according to the detailed description of the first embodiment, an external plug element is inserted into the contact portion 8 of the contact device 1, appropriate forces are exerted in the positive z-direction and, resp., in the direction of extension of the contact part 6 so that the first distance A1 is covered depending on the force exerted upon inserting the plug element and the center part 5 approaches the lower surface of the cover element 16 and, resp., contacts the same (at least temporarily). In this way, the already described delimitation of the movement in the positive z-direction during a mounting operation, i.e. upon insertion of a plug element not shown in the Figures, is reached by the cover element 16.

Figure 6:
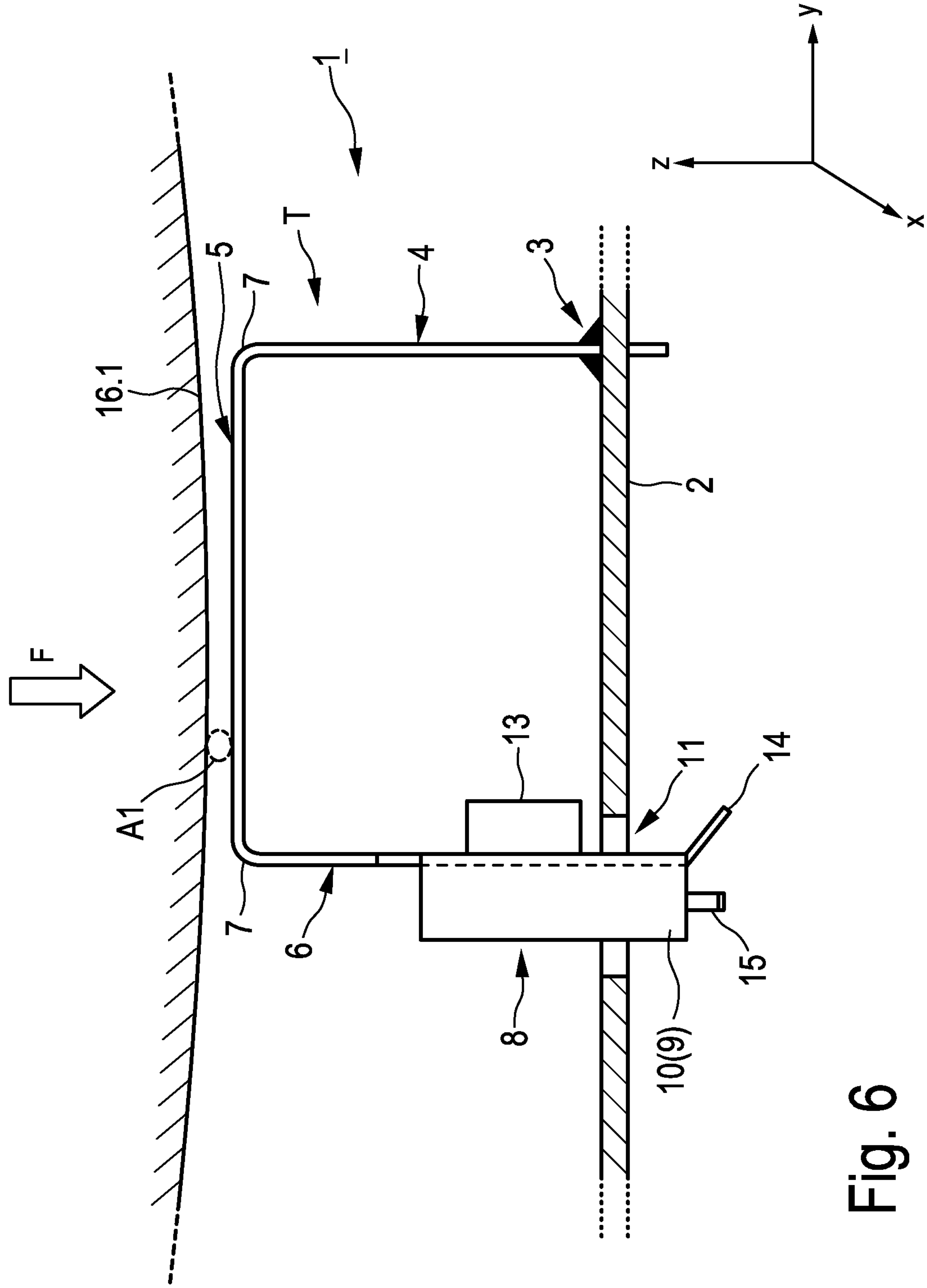
FIG. 6 shows an overall representation of the contact device according to a third embodiment of the present invention in combination with an elastic external cover element.

In the modification of the first and second embodiments shown in FIG. 6, the cover element 16.1 is made of a material elastic to a predefined extent so that deformation and thus downward curvature (in the negative z-direction) is imparted to the cover element 16.1 according to the present modification in an elastic manner when applying a force F substantially perpendicularly from above onto the cover element 16.1.

The cover element 16.1 according to the modification is configured in such way that insertion of an external plug element into the contact portion 8 is supported in a simple manner and especially during the inserting operation the delimitation of the movement with forces acting in the positive z-direction on the contact portion 8 is more strongly delimited. In this way a reduction of the first distance A1 can be brought about merely for the inserting operation of the external plug element, for example.

In detail, during the inserting operation of the external plug element (not shown in the Figures) the cover element 16.1 is curved downwards in the direction of the center part 5 of the contact device 1 applying an external force F (cf. arrow in FIG. 6) to the cover element 16.1 in the negative z-direction so that, when forces in the positive z-direction act on the contact portion 8, only a small movement in the positive z-direction is possible and the center part 5 contacts the downwards curved surface of the cover element 16.1 immediately or after a very short distance (reduced first distance A1) of a movement in the positive z-direction.

Compared to the representation in FIG. 4, the first distance A1 according to the present modification is thus significantly reduced to a smaller value or to approximately zero so that during the inserting operation and the forces occurring in the positive z-direction on the contact portion 8 merely a small movement enabled by the elasticity of the contact portion 8 and the contact part 6 may occur, whereas a further elastic movement in the positive z-direction according to the second movement S2 in FIG. 4 is not possible or is possible to a very small extent only.

Hence the force F exerted according to the representation in FIG. 6 in the negative z-direction on the cover element 16.1 for curving the cover element 16.1 in the direction of the center part 5 (in the negative z-direction) is applied only when an inserting operation for inserting an external plug element into the contact portion 8 is carried out. In so doing, generally high forces are applied to the contact portion 8 of the contact device 1. Thus a possible movement during the inserting operation in the positive z-direction is strongly delimited.

If the inserting operation of the plug element in the contact portion 8 is completed, the force F acting on the cover element 16.1 in the negative z-direction is neutralized and the cover element 16.1 elastic in a predefined manner returns to its home position in which the already described first distance A1 (or a similar distance hereto in the idle state or in the idle position of the contact device 1) is formed between the lower side of the cover element 16.1 and the upper side of the center part 5. After inserting the plug element into the contact portion 8, thus the first distance A1 required for free oscillation and oscillatory uncoupling caused in this way between the external plug element and the printed circuit board 2 is formed so that upon completion of the inserting operation all required distances (A1, A2, A3) of the individual components of the contact device 1 are made available and thus free oscillation is guaranteed in the desired manner.

Upon inserting the plug element according to the modification of the first and second embodiments in connection with an elastic cover element 16.1 the possible movement of the contact part 6 and especially of the contact portion 8 is delimited by the reduced distance of the center part 5 from the elastic cover element 16.1 (first distance A1), wherein the third distance A3 of the contact portion 8 in the opening of the printed circuit board 2 is continued being maintained for compensating unavoidable transverse movements, however. Accordingly, the cover element 16.1 with its elastic characteristics is temporarily deformed during insertion of a plug element (not shown) into the contact portion 8 of the contact device 1 and returns to its home position after neutralizing the force F.

Irrespective of the temporary reduction of the first distance A1 obtained by the cover element 16.1 in the modification of the afore-described embodiments, the other afore-described advantages of the contact device 1 are equally achieved. The use of a cover element having elastic characteristics as those of the cover element 16.1 according to FIG. 6 is equally possible and advantageous in the first or second embodiment of the contact device 1. The use of the elastic cover element 16.1 is equally ensured for the use of the upright lamellas, wherein in this case the cover element 16.1 is already adjacent to the center part 5 with a smaller travel distance due to the upright lamellas 17*a* standing on edge. After neutralizing the force F according to FIG. 6, the cover element 16.1 springs back into its home position having the predefined first distance A1.

By the application of a plurality of lamellas 17 the section modulus is reduced especially for lateral movements (movements in the x-y plane, S11, S12) and the section modulus is further reduced for these movements when the upright lamellas 17*a* are formed in the central portion 5.

The printed circuit board 2 on which the contact device 1 according to the invention is mountable may be arranged in a housing which is not shown in the Figures and which is covered by the cover means 16 or 16.1. In this case the contact device 1 is part of a module having a circuit means on the printed circuit board 2 on which the contact device 1 is arranged (mechanically mounted and electrically contacted). The entire module including the printed circuit board 2, the contact device 1, the housing and the cover element 16 and, resp., 16.1 is largely uncoupled in terms of oscillations from oscillations and movements of the external plug element, for example, by the elastic configuration in the afore-described manner. The present invention thus also covers the module in which the contact device 1 is applied.

The present invention has been described in the foregoing in connection with preferred embodiments.

However, it is understood to those skilled in the art working in this field that the configuration of the present invention according to the described Figures and in combination with the respective parts and components as well as the exemplary information is not to be interpreted in a restrictive manner. The invention is not limited to the given illustration in the Figures and especially to dimensions and arrangements. All embodiments and variants which are covered by the enclosed claims are considered to pertain to the invention.

What is claimed is:

1. A contact device which is adapted to be mechanically mountable and electrically connectable on a printed circuit board by a fastening portion and serves for receiving an external plug element, comprising a contact portion for inserting the external plug element for forming an electrical contact, an elastic support element for movably supporting the contact portion and for providing a possibility of movement in all spatial directions, wherein the support element includes a fastening part by which the contact device is mounted on the printed circuit board, a contact part for directly supporting the contact portion and a center part for connecting the fastening part to the contact part, and the fastening part and the contact part are bent relative to the center part, and wherein the possibilities of movement of the contact part and the center part are limited by predetermined distances from neighboring external limit means in the mounted state of the contact device on the printed circuit board, and further wherein after mounting the contact device on the printed circuit board the contact portion protrudes into an opening in the printed circuit board in a contact-free manner and the contact portion includes a stop element extending away from the contact portion, and wherein a movement in the direction of extension of the contact part is delimited by the stop element or by any one of external limit means.

2. The device according to claim 1, wherein the fastening part, the center part and the contact part are formed of strip-shaped elastic material and a bending portion in which the respective parts are bent relative to each other is formed between the fastening part and the center part as well as between the center part and the contact part.

3. The device according to claim 1, wherein the printed circuit board is inserted in a housing including a cover element and the cover element is arranged adjacent to the center part of the contact device mounted on the printed circuit board and constitutes the limit element.

4. The device according to claim 1, wherein after mounting the contact device on the printed circuit board the contact portion protrudes into an opening in the printed circuit board in a contact-free manner and the contact portion is delimited upon movement in the plane of the printed circuit board by the opening in the printed circuit board.

5. The device according to claim 4, wherein the fastening part, the center part and the contact part are formed of strip-shaped elastic material and a bending portion in which the respective parts are bent relative to each other is formed between the fastening part and the center part as well as between the center part and the contact part.

6. The device according to claim 5, wherein the contact device is orientated, after mounting on the printed circuit board by means of the fastening part, relative to the printed circuit board so that in the force-free state the contact device takes a position having the predetermined distances from the external limit means.

7. A contact device which is adapted to be mechanically mountable and electrically connectable on a printed circuit board by a fastening portion and serves for receiving an external plug element, comprising a contact portion for inserting the external plug element for forming an electrical contact, an elastic support element for movably supporting the contact portion and for providing a possibility of movement in all spatial directions, wherein the support element includes a fastening part by which the contact device is mounted on the printed circuit board, a contact part for directly supporting the contact portion and a center part for connecting the fastening part to the contact part, and the fastening part and the contact part are bent relative to the center part, and wherein the possibilities of movement of the contact part and the center part are limited by predetermined distances from neighboring external limit means in the mounted state of the contact device on the printed circuit board, and further wherein the fastening part and the contact part are formed partly and the center part is formed completely of a plurality of lamellas and the lamellas extend from a first intermediate land of the fastening part via the center part to a second intermediate land of the contact part.

8. The device according to claim 7, wherein the lamellas and interstices between the lamellas as to their width and longitudinal extension extend in a respective plane of extension of the fastening part, the center part or the contact part or at least partially in their widthwise extension include a predetermined angle relative to the plane of extension of the respective fastening part, the center part or the contact part.

9. The device according to claim 8, wherein at least in the area of the center part and at least partially in their widthwise extension the lamellas include the predetermined angle relative to the plane of extension of the center part and the angle is a right angle or is less than 90°.

10. The device according to claim 9, wherein the width of the lamellas and the respective interstices between the lamellas are equal or different for all lamellas and interstices.

11. The device according to claim 7, wherein the width of the lamellas and the respective interstices between the lamellas are equal or different for all lamellas and interstices.

12. The device according to claim 1, wherein the contact device is orientated, after mounting on the printed circuit board by means of the fastening part, relative to the printed circuit board so that in the force-free state the contact device takes a position having the predetermined distances from the external limit means.

13. The device according to claim 1, wherein the fastening part and the contact part are formed partly and the center part is formed completely of a plurality of lamellas and the lamellas extend from a first intermediate land of the fastening part via the center part to a second intermediate land of the contact part.

14. The device according to claim 13, wherein the lamellas and interstices between the lamellas as to their width and longitudinal extension extend in a respective plane of extension of the fastening part, the center part or the contact part or at least partially in their widthwise extension include a predetermined angle relative to the plane of extension of the respective fastening part, the center part or the contact part.

15. The device according to claim 14, wherein at least in the area of the center part and at least partially in their widthwise extension the lamellas include the predetermined angle relative to the plane of extension of the center part and the angle is a right angle or is less than 90°.

* * * * *